United States Patent
Ionov

[19]

[11] Patent Number: 6,010,966
[45] Date of Patent: Jan. 4, 2000

[54] HYDROCARBON GASES FOR ANISOTROPIC ETCHING OF METAL-CONTAINING LAYERS

[75] Inventor: Pavel Ionov, Sunnyvale, Calif.

[73] Assignee: Applied Materials, Inc., Santa Clara, Calif.

[21] Appl. No.: 09/130,920

[22] Filed: Aug. 7, 1998

[51] Int. Cl.[7] .................................................. H01L 21/306
[52] U.S. Cl. .................... 438/706; 438/719; 252/79.1; 252/79.4
[58] Field of Search .................... 438/706, 719; 252/79.4, 79.1

[56] References Cited

U.S. PATENT DOCUMENTS

| | | | |
|---|---|---|---|
| 3,943,042 | 3/1976 | Cook, Jr. ................................. | 205/505 |
| 4,126,523 | 11/1978 | Wong ..................................... | 205/212 |
| 4,618,398 | 10/1986 | Nawata et al. ......................... | 438/720 |
| 4,666,555 | 5/1987 | Tsang ..................................... | 156/643 |
| 4,729,815 | 3/1988 | Leung .................................... | 156/643 |
| 4,915,777 | 4/1990 | Jucha et al. ............................ | 156/643 |
| 4,997,520 | 3/1991 | Jucha et al. ............................ | 156/643 |
| 5,110,408 | 5/1992 | Fujii et al. ............................. | 156/643 |
| 5,350,484 | 9/1994 | Gardner et al. ....................... | 438/669 |
| 5,597,444 | 1/1997 | Gilton ................................... | 438/710 |

FOREIGN PATENT DOCUMENTS 0463373  1/1992  European Pat. Off. .

*Primary Examiner*—William Powell
*Assistant Examiner*—Lynette T. Umez-Eronini
*Attorney, Agent, or Firm*—Janah and Associates

[57] ABSTRACT

A process for anisotropically etching a metal-containing layer 15 on a substrate 10 is described. The etching process uses an energized process gas of a comprising halogen-containing etchant gas for etching the metal-containing layer to form volatile metal compounds, and hydrocarbon inhibitor gas having a carbon-to-hydrogen ratio of from about 1:1 to about 1:3, to deposit inhibitor on etched metal features and provide anisotropic etching. More preferably, the hydrocarbon inhibitor gas comprises a high carbon-to-hydrogen ratio of from about 1:1 to 1:2.

22 Claims, 3 Drawing Sheets

HYDROCARBON GASES FOR ANISOTROPIC ETCHING OF METAL-CONTAINING LAYERS

BACKGROUND

This invention relates to a process for etching a metal-containing layer on a semiconductor substrate.

Figure 1A:
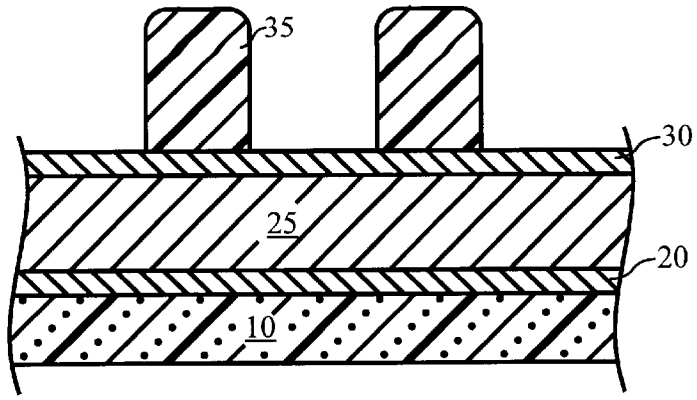
Figure 1B:
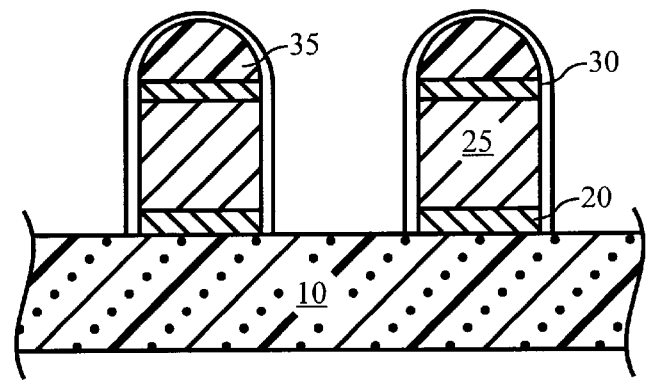

Referring to FIGS. 1a and 1b, the present process is used to etch a stacked metal-containing layer 15 on a semiconductor substrate 10, for example, a silicon or gallium arsenide wafer. The metal-containing layer 15 typically comprises a diffusion barrier and/or adhesion promoting layer 20, such as Ti, TiN, Ta, TaN, W, WN, and the like, a metal layer 25 of aluminum, copper, tungsten, or their alloys with each other and/or other materials, and an anti-reflective layer 30, such as TiN, silicon oxynitride, or an organic anti-reflective material. Metal interconnect lines 32 are formed by etching the stacked metal layer 15 to electrically connect the active devices on the substrate 10. A typical process sequence for forming the metal interconnect lines 32 comprises the steps of (1) sequentially depositing each layer 20, 25, 30 of the metal-containing layer 15 on a substrate 10, (2) formation of a mask layer 35 that captures a pattern that is to be transferred into the metal-containing layer 15, and is typically composed of photoresist, but can be made of other materials, such as silicon dioxide or silicon nitride, (3) etching the metal-containing layer 15 to transfer the pattern captured in the mask into the metal-containing layer 15 to form the interconnect lines 32, (4) ashing with oxygen-containing plasma to remove (or strip) any remaining resist (if any is present in the mask) and to passivate metal-containing lines by removing residual etching species to prevent corrosion, (5) depositing a dielectric layer (not shown) to isolate the metal interconnect lines 32 from the next level of metal interconnect lines and/or the environment, (6) additional sequences of process steps to form conductive metal studs (not shown) in the dielectric above the metal interconnect lines 32 to connect them to the lines in the next metal layer, and (7) planarization of the dielectric layer that can be a result of dielectric deposition process or can be performed by chemical mechanical polishing (CMP) after the studs are formed. The present invention relates to etching step (3) in this sequence in which the pattern of lines or other features captured in the photoresist or other mask layer is transferred into the metal-containing layer 15 by a plasma etch process (sometimes referred to as reactive ion etching or RIE).

As the semiconductor industry strives to build cheaper and faster devices, it has to increase surface density of the devices on the semiconductor substrate 10 while trying to keep the conductivity of the metal interconnects as high as possible. As a result, with each device generation the smallest in-plane dimensions of the interconnect lines 32 (also known as critical dimension or CD) are scaled down faster than the stacked metal layer thickness. At present, it is not uncommon to see interconnect lines 32 with the aspect ratio (which is the ratio of line height to its width) as high as two or three, and in the near future it may be as high as four. This poses especially stringent requirements on the etch process.

Figure 2A:
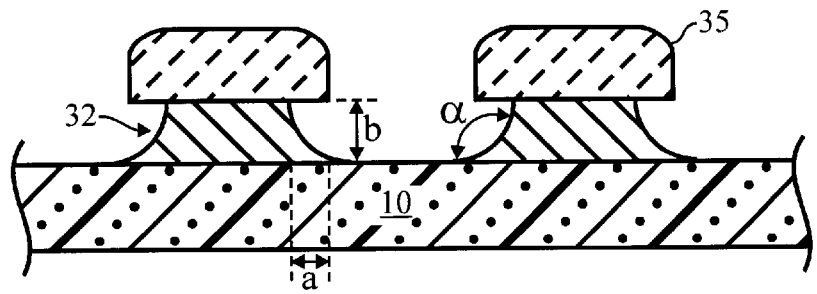
Figure 2B:
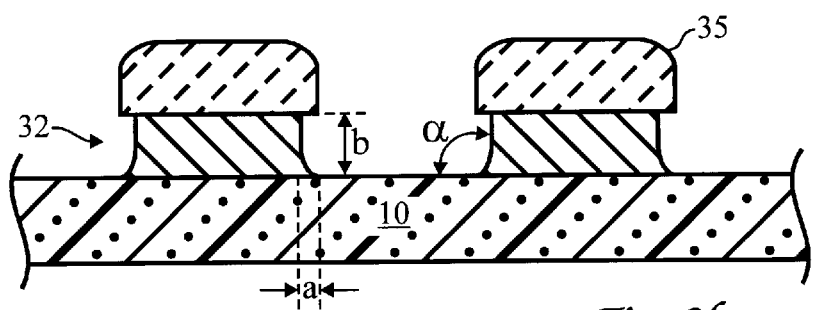
Figure 2C:
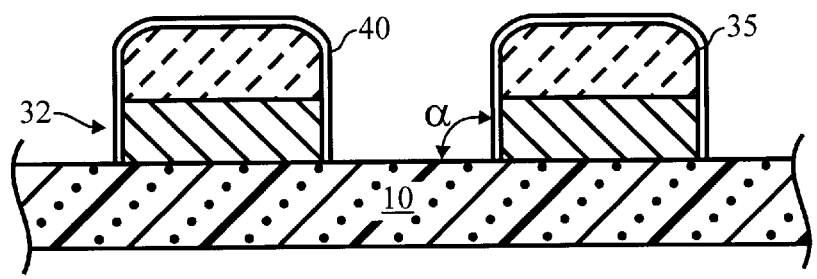
Figure 2D:
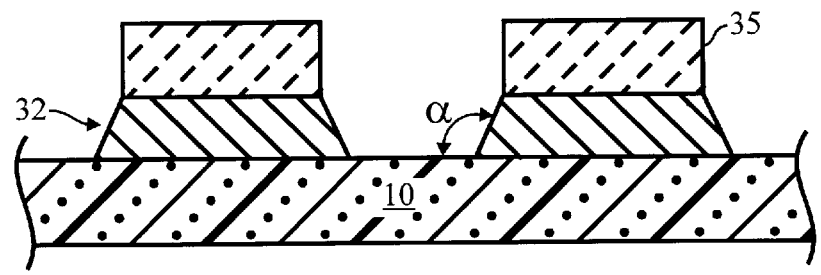

To fabricate such high aspect ratio interconnect lines 32, it is necessary to perform highly anisotropic etching of metal-containing layer 15. FIG. 2a illustrates isotropic etching in which the etch rates in the direction parallel to the plane of the substrate 10 (into the side-wall) are substantially the same as the etch rates that proceed vertically (so that the distance a is the same as the distance b). This results in undercutting below the mask layer 35 that makes it difficult to etch spaces between the interconnect lines 32 that are narrower than twice the thickness of the etched depth, which means that only an aspect ratio (for the line spacing) of less than 0.5 can be achieved. FIGS. 2b through 2d show anisotropic etching processes. FIG. 2b shows etching still proceeding into the sidewall but at a slower rate than etching in the vertical direction (a<b). The most desirable case of highly anisotropic etching is shown in FIG. 2c, when etch rate in the direction parallel to the substrate is 10 exactly zero (a=0). FIG. 2d illustrates the case of highly anisotropic etch, when the bottom of an etched line is wider than its top, or in other words etch rate in the parallel direction is negative (a<0) and the profile angle $\alpha$ is more than 90°. Though, all of these situations are possible while etching metals and alloys such as aluminum, copper, tungsten, titanium, tantalum, etc., the shape of the etched feature shown in FIG. 2c is the most desirable because it allows, at least in principle, a spacing between metal interconnect lines 32 of very high aspect ratios.

The highly anisotropic etch achieved today is performed in a plasma etching apparatus. Plasma provides anisotropic etching because it possesses a highly anisotropic source of energy-ions. The ions present in the plasma are accelerated towards the substrate 10 in the plasma sheath, and collisions of these ions ($X^+$, FIG. 3) with the surfaces parallel to the substrate provide additional energy (in excess of the thermal energy) which accelerates certain surface reactions. Unlike the ions, neutral species ($Y°$) are not directional and, therefore collide with all the surfaces exposed to plasma. The thermal energy available from the surface and the neutral plasma species does not differentiate between the surface orientation. Thus, if the set of surface reactions responsible for etching is not sensitive to the additional energy provided by the ions, as is the case for etching many metals with halogens, such as etching aluminum with chlorine or etching tungsten with fluorine (in the absence of contaminants), isotropic etching is obtained. When, on the other hand, the etching reaction has an activation energy that is higher than the thermal energy, it only will take place on those substrate surfaces that are subjected to the energetic plasma ion bombardment, and etching proceeds essentially in the direction perpendicular to the substrate 10.

To facilitate etching, the etching process gases include reactive etching gases that easily react with the material being etched to form volatile gaseous byproducts which are removed from the reactor with a vacuum pump. For example, it is known that halogen gases react with many metals to form volatile metal halides. However, most metals (such as aluminum which is currently used as an interconnect material and copper that is expected to replace aluminum) spontaneously react with halogen gases. Thus highly anisotropic etching of the metal-containing layer 15 is not possible in the absence of reactants other than halogen gases. To achieve anisotropy, a gas inhibitor or passivator that forms an inhibitor layer 40 deposited on sidewalls of the freshly etched metal features is added to the etching gas. The inhibitor layer 40 partially or completely blocks the access of the etching gas (usually halogen) to the sidewall to provide anisotropic etch. At the same time, it does not accumulate on the surfaces subjected to the ion bombardment, as it is being sputtered or etched off with the ion assistance, thus allowing the etching process to proceed. Thus the gas inhibitor has two somewhat conflicting requirements, it has to be deposited easily on the sidewalls and form a dense layer impermeable to etch gas, and it has to be easily etchable under ion bombardment in the atmosphere of the same etch gas. These requirements make finding a good inhibitor gas difficult, and at the same time, it is essential for successful profile etching of metal interconnect lines 32.

In conventional chlorine-based etch of aluminum-containing interconnects, organic photoresist, typically used as a mask material, is etched away (eroded) at a rate that is typically around 0.2 to 0.5 times the etch rate of the aluminum-containing layer. It is believed that the byproducts of this photoresist erosion serve as a passivator gas. There are two reasons to think that this is the case. It is well known that aluminum etch process conditions can be adjusted to change the etching selectivity (relative etch rate) of aluminum to photoresist. It is known that by reducing the etching selectivity or by sacrificing more of the photoresist material, etching becomes more anisotropic (since the protective action of the inhibitor is reduced on smaller, high aspect ratio features, the increased photoresist erosion allows anisotropic etching of smaller features). Also, a compositional analysis of the sidewall polymer reported in an article by P. Czuprynski, O. Joubert, L. Vallier, M. Puttock and M. Heitzmann, *J. Vac. Sci. Technol. B,* 16(1), (1997), 147, demonstrated that the sidewall polymer contains a large amount of carbon—the main atomic component of the photoresist. Since their etch gases included only $Cl_2$ and $BCl_3$, the carbon could originate only from the photoresist that is primarily composed of carbon and hydrogen. Thus, in a typical aluminum etch processes, the byproducts of photoresist etching process are an integral part of the etching chemistry and provide anisotropic etching of the metal-containing layers 15.

As the critical dimensions of the etched features continue to shrink, it becomes more difficult to obtain anisotropic etching or to control etch profiles by conventional methods that rely on photoresist erosion. Smaller critical dimensions and larger aspect ratios require more inhibitor species be present in the plasma for profile control because it is more difficult for the inhibitor to penetrate into the narrower spaces between the etched metal interconnect lines 32. However, less photoresist is available because conventional lithography methods can produce small features only if the photoresist layer is sufficiently thin. There is often not enough photoresist material in the thin photoresist mask layer 35 to provide sufficient carbon species that deposit and control the etch profile. Also, it is often beneficial to use mask materials other than organic photoresist, such as silicon dioxide or silicon nitride (also called hard masks). These materials have the advantage of not being easily etched in a chlorine-containing plasma which is a more commonly used for etching aluminum-containing layers. Thus modern etching processes often fail to provide sufficient inhibitor species to anisotropically etch features in the metal layers.

Thus there is a need for an etching process that provides anisotropic etching of metal layers that is not dependent upon the thickness or composition of the photoresist layer on the substrate. There is a further need for an etching process that provides highly anisotropic etching of metal features, even if the etched features have high aspect ratios and small critical dimensions. There is especially need for a process that provides anisotropic etching of metal layers that are etched with inorganic hard masks with thin overlying photoresist layers.

SUMMARY

The process of the present invention is capable of anisotropically etching metal features having high aspect ratios and small critical dimensions in semiconductor substrates. In the process, a substrate having a metal-containing layer is placed in a process zone and exposed to an energized process gas to etch the metal-containing layer on the substrate. The process gas comprises a halogen-containing etchant gas for etching the metal-containing layer to form volatile metal compounds, and a hydrocarbon inhibitor gas having a high carbon-to-hydrogen ratio of from about 1:1 to about 1:3, to anisotropically etch the metal-containing layer on the substrate. More preferably, the hydrocarbon inhibitor gas comprises a high carbon-to-hydrogen ratio of from about 1:1 to 1:2.

The hydrocarbon inhibitor gas composition is particularly useful for etching of metal-containing layers used to form interconnects, such as etching of aluminum or copper or their alloys with chlorine-containing energized process gas, or etching tungsten with fluorine-containing energized process gas, and is especially useful when the mask material is silicon dioxide or silicon nitride, or when it is photoresist in a thin layer that does not provide sufficient inhibitor species.

DRAWINGS

These and other features, aspects, and advantages of this invention will be better understood from the following drawings and description, which illustrate and describe examples performed according to the process of the present invention.

Figure 3:
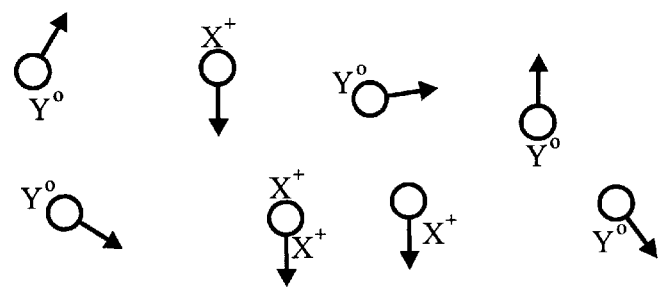
Figure 4:
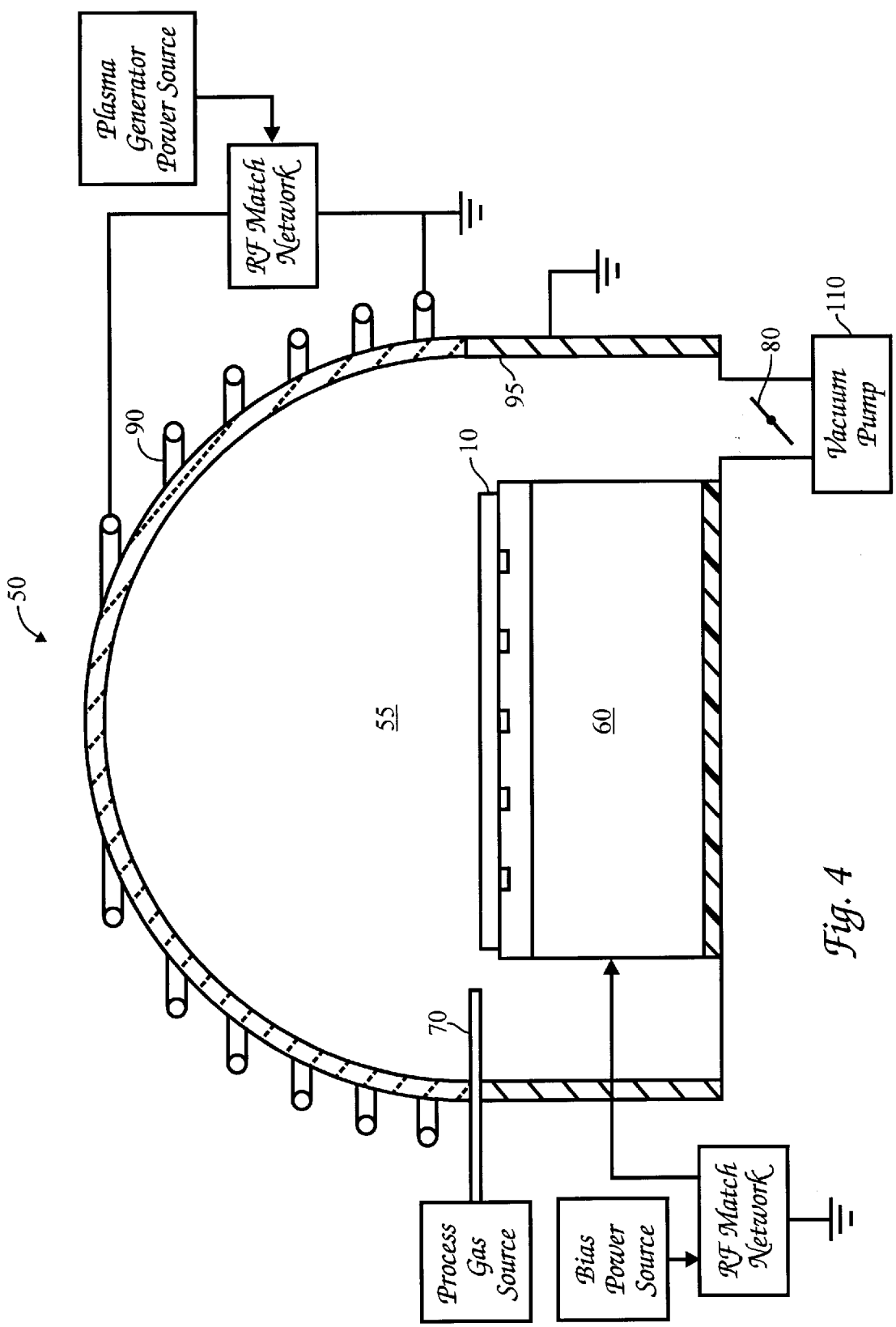

FIG. 1*a* is a schematic sectional view of a stacked metal-containing layer on a semiconductor substrate prior to etching;

FIG. 1*b* is a schematic sectional view of stacked metal-containing layer on a semiconductor substrate after etching;

FIG. 2*a* is a schematic sectional view of isotropically etched features;

FIG. 2*b* is a schematic sectional view of moderately anisotropically etched features;

FIG. 2*c* is a schematic sectional views of anisotropically etched features having ideal vertical sidewalls;

FIG. 2*d* is a schematic sectional views of highly anisotropically etched features having a positive profile;

FIG. 3 is a schematic view of ions bombarding a substrate showing highly directional ions and randomly directional neutrals; and FIG. 4 is a schematic sectional view of a process chamber suitable for practicing the etching process of this invention.

DESCRIPTION

The present invention provides a method for highly anisotropic etching of a substrate 10 having a metal-containing layer 15. The metal-containing layer 15 is typically a stack of layers of metal-containing alloys and compounds, as shown in FIGS. 1*a* to 1*b*, and is etched in a conventional process chamber 50. The particular embodiment of the process chamber 50 shown in FIG. 4 is provided only to illustrate the invention, and should not be used to limit the scope of the invention. Other process chambers that can be used to practice the present process include parallel plate reactors, different inductively coupled plasma reactors, electron cyclotron resonance reactors, or helicon wave reactors.

To perform the etching process, a substrate 10 is placed on a support 60 in the chamber 50, and the chamber is evacuated to a low pressure, typically less than about $10^{-4}$ Torr. Process gases are introduced into a process zone 55 of the chamber 50 through a gas nozzle 70 and the chamber pressure is adjusted regulating the position of a throttle valve 80. After the pressure has been stabilized, the process gas is energized to ignite a plasma by applying source RF power to a coil 90 and bias RF power between the support 60, at least a portion of which is electrically conductive and serves as a cathode, and a grounded sidewall 95 of the chamber 50. As a plasma or energized process gas is generated from the process gas, the plasma reacts with the metal-containing layer 15 to form volatile products that are removed from the chamber 50 with the exhaust gases by a vacuum pump 110. Upon completion of etching, the RF powers and process gases are turned off and substrate is removed from the process chamber 50. To control the temperature of the substrate during the etching process, a coolant gas such as helium, is flowed in groves on the surface of the support 60. The substrate 10 is held in place using a mechanical or electrostatic chuck to prevent it from lifting because of coolant gas pressure.

The process gas comprises at least one gas that is an etchant gas that reacts with the materials of the metal layers 15 and to form volatile gaseous compounds, or that produces such a reactive gas upon dissociation in the plasma. The etchant gas is typically a halogen-containing gas because the metal layers 15 react readily with halogens, and the products are often volatile. The optimal choice of a specific etchant gas composition depends upon the composition of the metal-containing layer 15. For example, for metal interconnect etching processes, suitable halogen etchant gases include $HCl$, $BCl_3$, $Cl_2$, $SF_6$, $CF_4$, and $CF_2Cl_2$, as generally described in *VLSI Technology, Second Edition,* Chapter 5, by S. M. Sze, McGraw-Hill Publishing Company (1988), which is incorporated herein by reference. For aluminum or aluminum alloys and compounds, chlorine-containing gases, such as $Cl_2$, $BCl_3$, and $CCl_4$, and mixtures thereof, are preferred. For tungsten or tungsten alloys and compounds, fluorine-containing gases, such as $SF_6$, $NF_3$ or $F_2$, and mixtures thereof are preferred; alloys and compounds that primarily contain copper or titanium can be etched with either fluorine or chlorine-containing gases. Although the invention is illustrated using particular halogen gases it should be understood that the choice of etchant gas is not essential to the present invention, and therefore, the invention should not be limited to the halogen gases described herein.

According to the present invention, the process gas further contains a hydrocarbon inhibitor gas. The hydrocarbon inhibitor gas and the products of its reactions in the plasma are deposited as an inhibitor layer 40 on the freshly etched metal features to provide anisotropic etching. The hydrocarbon inhibitor gas has a general formula $C_xH_y$ with a ratio of x to y of 1:1 to 1:3. One important benefit of using a hydrocarbon inhibitor gas is that it would form organic based inhibitor layer 40. As opposite to inorganic inhibitor layers, such as nitride, boride, or oxide based passivation layers, a predominantly organic inhibitor layer 40 formed with the addition of hydrocarbon inhibitor gas can be easily removed by oxygen plasma during strip and/or passivation process. Such removal of the inhibitor layer 40 after the etching process is needed to prevent corrosion of the etched features upon exposure to air. It is believed that halogens trapped in the side-wall of inhibitor layer hydrate in the presence of moisture in air leading to corrosion.

Preferably, the hydrocarbon inhibitor gas has a high atomic ratio of carbon to hydrogen. Since organic photoresists also have high ratio of carbon to hydrogen, addition of such a hydrocarbon to the process gas can replace photoresist erosion as a source of inhibitor species. When etching is performed with a silicon dioxide or silicon nitride mask or with high etching selectivity with a photoresist mask, the hydrocarbon inhibitor gas provides carbon-containing species similar to those provided by photoresist erosion that result in anisotropic etching. It is also important to have a high carbon to hydrogen ratio because excessive hydrogen can react with the inhibitor layer 40 deposited on the sidewalls of the etched featured to form volatile compounds, thus etching it away and interfering with anisotropic etching processes. Excess hydrogen can also combine with the halogens in the plasma to form hydrogen halides that are less reactive with the metal-containing layers than atomic or molecular halides that are the main etching species. In addition, since it does not react to form volatile products with metals, hydrogen slows down etching simply by diluting the composition of the plasma gas. Thus, hydrocarbons with high hydrogen content are less effective as an inhibitor gas and also cause a lower etch rate than would hydrocarbons with a lower hydrogen content.

As previously discussed, the hydrocarbon inhibitor gas has to have high carbon to hydrogen ratio of at least 1:3, or more preferably of at least 1:2. Hydrocarbon inhibitor gases having a high carbon concentration may have to contain carbon-carbon double bonds or triple bonds, or cyclic bonds, or both. Thus, the hydrocarbon inhibitor gas can be, for example, an alkene or an alkyne, such as ethylene, propylene, butylene, acetylene (ethyne), propyne, or butyne; or an aromatic compound such as a 5- or 6-member cyclic hydrocarbon gas, for example benzene, xylene, or a non-aromatic ring compound, such as cyclobutadiene, cyclopentene or cyclohexene. In a preferred embodiment, the hydrocarbon inhibitor gas consists essentially or only of acetylene $(C_2H_2)$ which has a single triple carbon-carbon bond. Acetylene has a very high carbon-to-hydrogen ratio of 1:1 that is expected to provide more efficient passivation and inhibition without excessive reduction in etching rates. A hydrocarbon of lower molecular weight, such as acetylene, is more desirable as it has higher vapor pressure, and therefore, is easier to introduce into the plasma. Lower molecular weight also provides inhibitor species having a composition similar to the photoresist byproducts it is replacing, which are also believed to have relatively low molecular weight. Thus, the hydrocarbon inhibitor gas preferably comprises from about 2 to about 10 carbon atoms.

The volumetric flow rate of the hydrocarbon inhibitor gas as well as other process parameters has to be tuned for optimal process performance. By varying the flow of the hydrocarbon inhibitor gas, the deposition rate of the inhibitor layer 40 can be varied to obtain good etch profiles and etch rates. If acetylene is used, the flow is expected to be from 3% to 30% of that of the etchant gas and will depend on the application. If other hydrocarbon is used, optimum flow will decrease with more carbons in the molecule and may differ for molecules with different carbon to hydrogen ratios. It is expected that a useful volumetric flow ratio of the halogen-containing gas to hydrocarbon inhibitor gas would be from about 50:1 to about 3:1.

PROSPECTIVE EXAMPLES

Since process conditions required to etch different metals are substantially different, the following three prospective examples are given to illustrate the application of the present invention. Etching in these examples is assumed to be performed in a chamber of the design shown in FIG. 4, with a process volume of about 20 liters. The wafers are assumed to be 200 mm in diameter.

Example 1

In this example, etching of a conventional aluminum-containing stack with silicon dioxide mask is performed. The aluminum-containing stack comprises, from bottom to top, 800 Å of TiN, 6,000 Å of aluminum with 0.5% Cu alloy, 300 Å of TiN and 2,500 Å thick silicon dioxide mask. Etching is performed in chlorine based plasma and the following are expected to be the ranges for the process parameters. Chlorine flow rate is from about 30 sccm to about 150 sccm; $BCl_3$ flow rate is from about 5 sccm to about 100 sccm; acetylene flow rate is from about 3 sccm to about 30 sccm; RF power to the coil is from about 200 W to about 1500 W; RF power to the cathode (bias power) is from about 30 W to about 300 W; process chamber pressure is from about 1 mTorr to about 50 mTorr; and wafer surface temperature is from about 50° C. to about 100° C.

Example 2

In this example, etching of a copper containing metal layer with silicon dioxide mask is performed. The stack contains layers (bottom to top) comprising 200 Å of tantalum, 300 Å of TaN, 5,000 Å of copper, 300 Å of TaN, and 5000 Å thick silicon dioxide mask. Etching is performed in a chlorine based plasma and the following are expected to be suitable process conditions. Chlorine flow rate is from about 30 sccm to about 150 sccm; $BCl_3$ flow rate is from zero to about 30 sccm; acetylene flow rate is from about 5 sccm to about 50 sccm; RF power to the coil is from about 200 W to about 1500 W; RF power to the cathode (bias power) is from about 150 W to about 600 W; process chamber pressure is from about 1 mTorr to about 50 mTorr; wafer surface temperature is from about 200° C. to about 400° C.

Example 3

In this example, etching of a conventional tungsten-containing stack with silicon dioxide mask is performed. The stack comprises, from bottom to top, 200 Å of titanium, 500 Å of TiN, 5,000 Å of tungsten, 300 Å of TiN and 2,000 Å thick silicon dioxide mask. Etching is performed in fluorine based plasma and the following are expected to be the ranges for the process parameters. $SF_6$ flow rate of from about 20 sccm to about 100 sccm; nitrogen flow from zero to about 20 sccm; argon flow from zero to about 200 sccm; acetylene flow rate of from about 3 sccm to about 30 sccm; RF power to the coil of from about 200 W to about 1500 W; RF power to the cathode (bias power) of from about 30 W to about 200 W; process chamber pressure of from about 2 mTorr to about 50 mTorr; wafer surface temperature of form about 0° C. to about 60° C.

Although this invention has been described in considerable detail with regard to the preferred version thereof, other versions are possible. For example, the plasma can be formed using a microwave plasma source, and the hydrocarbon inhibitor gas can be used to anisotropically etch other materials, including non-metal materials, such as dielectric or semiconductor materials. Therefore, the appended claims should not be limited to the description of the preferred versions contained therein.

What is claimed is:

1. A process for etching a metal-containing layer on a substrate, the process comprising the steps of:
   (a) placing the substrate in a process zone;
   (b) exposing the substrate in the process zone to an energized process gas comprising halogen-containing etchant gas for etching the metal-containing layer to form volatile metal compounds, and cyclic hydrocarbon inhibitor gas having a carbon-to-hydrogen ratio of from about 1:1 to about 1:3, to anisotropically etch the metal-containing layer on the substrate; and
   (c) exhausting the volatile metal compounds from the process zone.

2. A process according to claim 1 wherein the cyclic hydrocarbon inhibitor gas comprises a carbon-to-hydrogen ratio of from about 1:1 to about 1:2.

3. A process according to claim 2 wherein the cyclic hydrocarbon inhibitor gas comprises from about 3 to about 10 carbon atoms.

4. A process according to claim 3 wherein the cyclic hydrocarbon inhibitor gas comprises a 5- or 6-member cyclic group.

5. A process according to claim 4 wherein the cyclic hydrocarbon inhibitor gas comprises benzene, xylene, cyclobutadiene, cyclopentene, or cyclohexene.

6. A process according to claim 1 wherein the volumetric flow ratio of the halogen-containing gas to cyclic hydrocarbon inhibitor gas is from about 50:1 to about 3:1.

7. A process according to claim 1 wherein in step (a) the substrate comprises a mask layer comprising silicon dioxide or silicon nitride.

8. A process for etching a metal-containing layer on a semiconductor substrate, the process comprising the steps of:
   (a) placing into a process zone, a semiconductor substrate having a metal-containing layer comprising aluminum, copper, tantalum, titanium, tungsten, or their alloys and compounds, and an overlying patterned mask layer comprising silicon dioxide or silicon nitride;
   (b) exposing the substrate in the process zone to an energized process gas comprising (i) halogen-containing gas that forms volatile compounds upon reaction with the metal-containing layer, and (ii) cyclic hydrocarbon inhibitor gas having a carbon-to-hydrogen ratio of from about 1:1 to about 1:3, to anisotropically etch the metal-containing layer on the substrate; and
   (c) exhausting the volatile compounds from the process zone.

9. A process according to claim 8 wherein the cyclic hydrocarbon inhibitor gas comprises a carbon-to-hydrogen ratio of from about 1:1 to about 1:2.

10. A process according to claim 8 wherein the cyclic hydrocarbon inhibitor gas comprises 3 to 10 carbon atoms.

11. A process according to claim 10 wherein the cyclic hydrocarbon inhibitor gas comprises a 5- or 6-member cyclic group selected from the group consisting of benzene, xylene, cyclobutadiene, cyclopentene, or cyclohexene.

12. A process according to claim 8 wherein the volumetric flow ratio of the halogen-containing gas to the cyclic hydrocarbon inhibitor gas is from about 50:1 to about 3:1.

13. A process according to claim 8 wherein in step (a) the substrate comprises a mask layer comprising silicon dioxide or silicon nitride.

14. A process for etching an aluminum-containing layer on a substrate, the process comprising the steps of:
   (a) placing the substrate having the aluminum-containing layer, into a process zone;
   (b) exposing the substrate in the process zone to an energized process gas comprising a chlorine-containing gas that can react with aluminum to form volatile compounds, and a cyclic hydrocarbon inhibitor gas, to anisotropically etch the aluminum-containing layer on the substrate; and (c) exhausting the volatile compounds from the process zone.

15. A process according to claim 14 wherein the volumetric flow ratio of the chlorine-containing gas to the cyclic hydrocarbon inhibitor gas is from about 50:1 to about 3:1.

16. A process according to claim 14 wherein in step (a) the substrate comprises a mask layer comprising silicon dioxide or silicon nitride.

17. A process for etching a tungsten-containing layer on a substrate, the process comprising the steps of:
   (a) placing the substrate having the tungsten-containing layer, into a process zone;
   (b) exposing the substrate in the process zone to an energized process gas comprising a fluorine-containing gas that can react with the tungsten-containing layer to form volatile compounds, and a cyclic hydrocarbon inhibitor gas, to anisotropically etch the tungsten-containing layer on the substrate; and
   (c) exhausting the volatile compounds from the process zone.

18. A process according to claim 17 wherein the volumetric flow ratio of the fluorine-containing gas to the cyclic hydrocarbon inhibitor gas is from about 50:1 to about 3:1.

19. A process according to claim 17 wherein in step (a) the substrate comprises a mask layer comprising silicon dioxide or silicon nitride.

20. A process for etching a copper-containing layer on a substrate, the process comprising the steps of:
   (a) placing the substrate having the copper-containing layer, into a process zone;
   (b) exposing the substrate in the process zone to an energized process gas comprising a chlorine-containing gas that can react with the copper-containing layer to form volatile compounds, and a hydrocarbon inhibitor gas, to anisotropically etch the copper-containing layer on the substrate; and
   (c) exhausting the volatile compounds from the process zone.

21. A process according to claim 20 wherein the volumetric flow ratio of the chlorine-containing gas to the cyclic hydrocarbon inhibitor gas is from about 50:1 to about 3:1.

22. A process according to claim 20 wherein in step (a) the substrate comprises a mask layer comprising silicon dioxide or silicon nitride.

* * * * *